United States Patent [19]
Voss

[11] 3,995,305
[45] Nov. 30, 1976

[54] THYRISTOR

[75] Inventor: Peter Voss, Munich, Germany

[73] Assignee: Siemens Aktiengesellschaft, Berlin & Munich, Germany

[22] Filed: Feb. 6, 1975

[21] Appl. No.: 547,595

[30] Foreign Application Priority Data
Feb. 18, 1974 Germany............................ 2407696

[52] U.S. Cl.................................. 357/38; 357/20; 357/68; 357/86
[51] Int. Cl.².......................................... H01L 29/74
[58] Field of Search ................... 357/20, 38, 39, 86, 357/68

[56] References Cited
UNITED STATES PATENTS

| | | | |
|---|---|---|---|
| 3,360,696 | 12/1967 | Neilson et al. | 357/38 |
| 3,573,572 | 4/1971 | Cooper et al. | 357/38 |
| 3,579,060 | 5/1971 | Davis | 357/38 |
| 3,681,667 | 8/1972 | Kokosa | 357/39 |
| 3,731,162 | 5/1973 | Suenaga et al. | 357/38 |
| 3,879,744 | 4/1975 | Dumas | 357/39 |

Primary Examiner—Michael J. Lynch
Assistant Examiner—Joseph E. Clawson, Jr.
Attorney, Agent, or Firm—Hill, Gross, Simpson, Van Santen, Steadman, Chiara & Simpson

[57] ABSTRACT

A thyristor is disclosed having a semiconductor body with at least four zones of alternate conductivity type in which the second zone has a control electrode and in which the first zone has a main emitter and first and second auxiliary emitters. The first auxiliary emitter is located between the control electrode and the second auxiliary emitter and the second emitter is located between the first auxiliary emitter and the main emitter. The ratio of the effective edge lengths of the first auxiliary emitter to the second auxiliary emitter and the ratio of the effective edge lengths of the second auxiliary emitter to the main emitter are matched to one another in such a manner that prior to the ignition of the first auxiliary emitter, ignition is initiated on the second auxiliary emitter, and then on the main emitter. The ratio of the effective edge lengths of the first auxiliary emitter to the second auxiliary emitter is ≥ 1:3 and the ratio of the effective edge lengths of the second auxiliary emitter to the main emitter is ≤ 1:4. Various specific structure shapes are described.

9 Claims, 6 Drawing Figures

THYRISTOR

BACKGROUND OF THE INVENTION

The present invention relates to a thyristor with a semiconductor body having at least four zones of alternate conductivity types, of which the first forms a main emitter and the second a base, with a control electrode connected to the base, and a first auxiliary emitter located between the main emitter and the control electrode, and with a second auxiliary emitter located between the first auxiliary emitter and the main emitter. Thyristors of this type have already been described with the aforementioned base and the other zones of the thyristor. The two auxiliary emitters form a structure serving to amplify the ignition current for the main thyristor, the main thyristor consisting of the main emitter, the aforementioned base, and the other zones of the semiconductor body. By means of this arrangement, it is possible to keep low the outlay for the control current source and, at the same time, insure a reliable ignition of the main thyristor by high control current.

Power thyristors are often provided with circuits featuring capacitors which are intended to attenuate voltage peaks. When the thyristor ignites, the capacitor discharges the currents, and high currents having current gradients of up to more than 1000 A/$\mu$s are formed. Such extreme loads can themselves occasion the destruction of the first auxiliary thyristor.

A semiconductor thyristor having a main emitter and first and second auxiliary emitters is described in the German application laid open for public inspection, No. 1,589,455. In this disclosure, the first auxiliary thyristor is always ignited first, followed by ignition of the second auxiliary emitter, and finally ignition of the main emitter. The first and second auxiliary thyristors each provide control current amplification gain of approximately 10. Thus, a control current amplification is achieved, which is the product of the two auxiliary thyristors, namely, a control current amplification gain in the order of 100 times.

BRIEF SUMMARY OF THE INVENTION

It is an object of the present invention to provide a thyristor which is so constructed that it will not be destroyed at any point even under loads featuring extreme current gradients.

The present invention is characterized in that the ratio of the effective edge lengths facing the control electrode, of first auxiliary emitter to second auxiliary emitter on the one hand and of second auxiliary emitter to main emitter on the other hand are matched to one another in such a way that prior to the ignition of the first auxiliary emitter ignition takes place on the second auxiliary emitter and subsequently on the main emitter. It is the edge length of the emitter which lies opposite a part of one of the emitter electrodes which contacts the base which is active in this process.

In the case of thyristors having conventionally employed doping profiles and dimensions for this purpose, the ratio of the effective edge lengths of first auxiliary emitter to second auxiliary emitter is made $\geq$ 1:3, and the ratio of the edge lengths of the second auxiliary emitter to the main emitter is made $\leq$ 1:4. In order to be able to accommodate the required edge lengths of the first auxiliary emitter on the semiconductor body, it is advisable for the control electrode and that edge of the first auxiliary emitter which faces the control electrode to possess interlocking comb or finger structures. The edge lengths between first and second auxiliary emitters can also be determined in that in an arrangement in which the control electrode is arranged centrally on the semiconductor body, the second auxiliary emitter is designed as circular ring segment.

Figure 1:
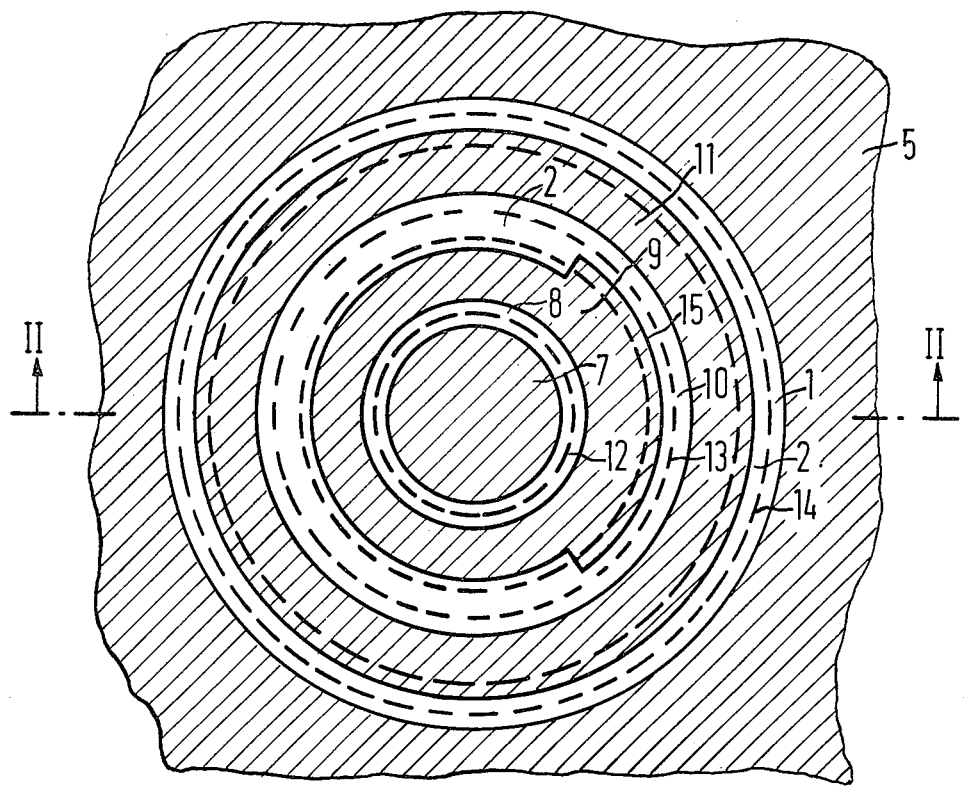
FIG. 1 diagrammatically illustrates one preferred form of the present invention in a fragmentary diagrammatic plan view.
Figure 3:
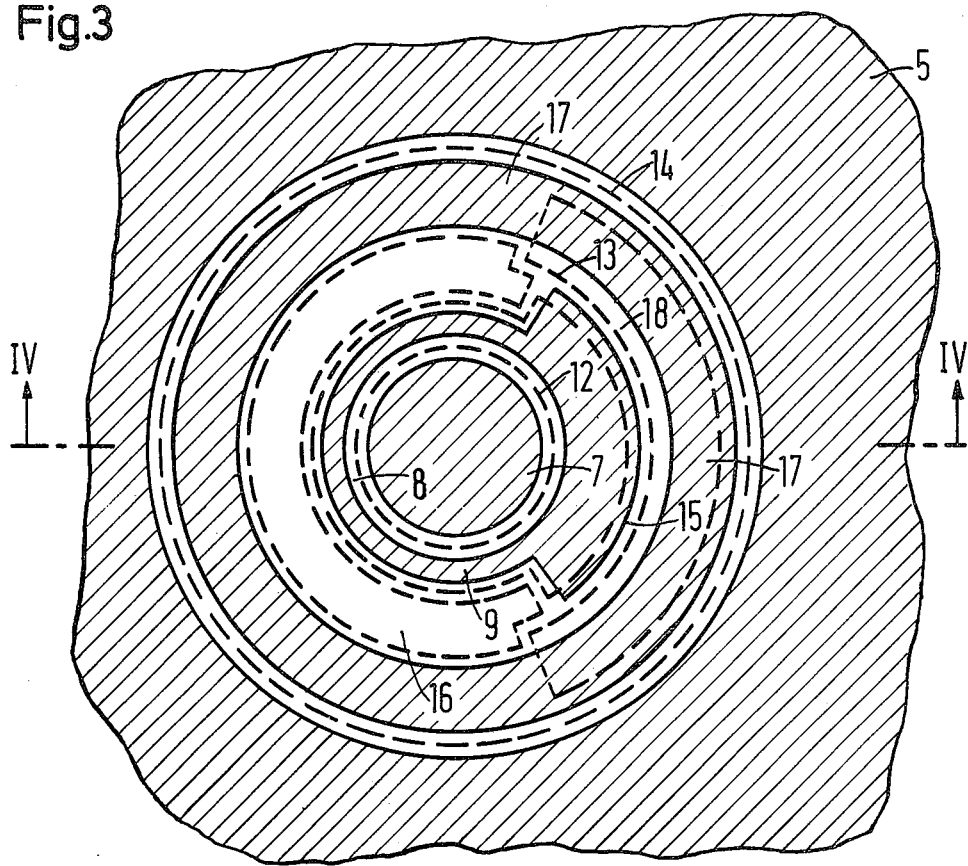
FIG. 3 diagrammatically illustrates a second preferred form of the present invention in a fragmentary diagrammatic plan view.
Figure 5:
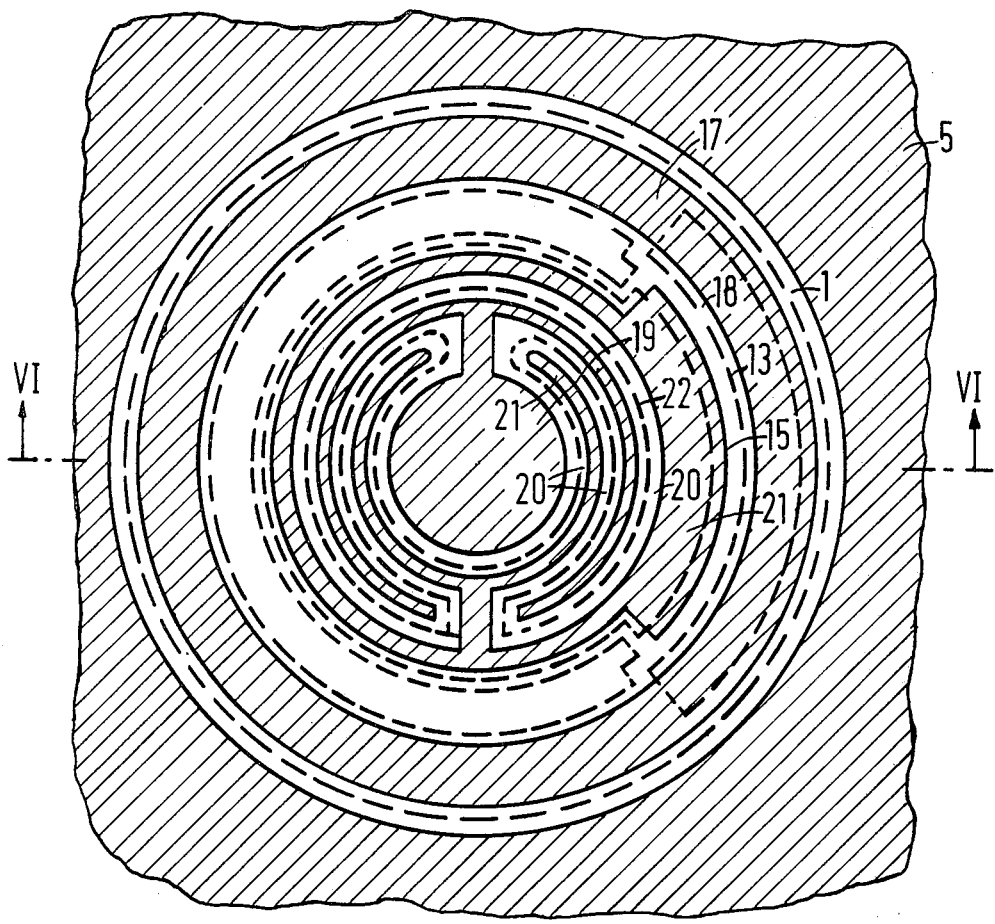
FIG. 5 diagrammatically illustrates a third preferred form of the present invention in a fragmentary diagrammatic plan view.

In connection with FIGS. 1, 3 and 5, it should be noted that these are diagrammatic only and that the dash lines show the edge boundaries of the emitters and the ballast segments, while the solid lines represent the edge boundaries of the electrodes. The diagonal hatching lines indicate the upper surface of the electrodes.

DESCRIPTION OF THE PREFERRED EMBODIMENTS

Figure 2:
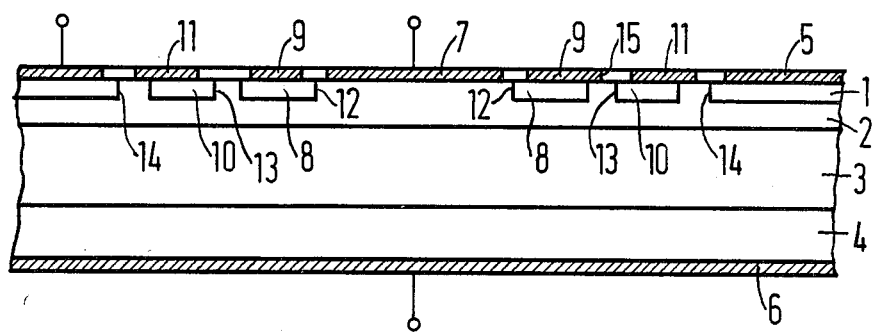
FIG. 2 is a diagrammatic sectional view of the embodiment of FIG. 1, as taken along the line II—II thereof.

Referring to FIGS. 1 and 2, the thyristor includes a main emitter 1, a base 2, and two other zones 3 and 4. The zones 1 to 4 are formed on a semiconductor body and are of alternate conductivity type. The main emitter is provided with a main emitter electrode 5 and the zone 4 is provided with an electrode 6. A control or gate electrode 7 is electrically connected to the base 2. Between the control electrode 7 and the main emitter 1 lies a first auxiliary emitter 8 and a second auxiliary emitter 10. The first auxiliary emitter 8 is electrically connected to a first auxiliary emitter electrode 9 and the second auxiliary emitter 10 is electrically connected to a second auxiliary emitter electrode 11. The edge lengths facing the control electrode 7, of the main emitter, and of the first and the second auxiliary emitters are referenced 14, 13 and 12, respectively. The first auxiliary emitter electrode 9 contacts the base 2 only along a circle segment 15. The length of this circle segment is approximately equal to the effective inner edge length 13 of the second auxiliary emitter 10.

The ignition of the thyristor is initiated by feeding a control current into the control electrode 7. The sequence of the ignition process in the arrangement is governed by the ratio of the effective edge lengths which face the control electrode, of first auxiliary emitter to second auxiliary emitter on the one hand and of second auxiliary emitter to main thyristor on the other hand.

The determination of these ratios is dependent upon the principle that the primary-igniting zone will be the more extensive, the higher the control current before the actual ignition, i.e., before the steep rise in current amplification characteristic of a thyristor. In cases where the control current for the auxiliary thyristor is relatively low, if this thyristor were to ignite first the initially ignited zone would be small and therefore, the danger of destruction by steeply rising load currents would be great.

However, by the selection of the emitter edge lengths of the individual thyristors it can be ensured that the first auxiliary thyristor does not ignite first and acts merely as control-current-amplifier for the second auxiliary thyristor. Here the fact is exploited that ignition does not occur until a current with a density of 0.3–1 A/$\mu$m of effective emitter edge length flows from the load circuit through the emitter edge. As a result of the control current amplified by the first auxiliary thyristor, the second auxiliary thyristor ignites more rapidly and in a larger area than would be the case without amplification. Accordingly, the area-related starting load is reduced. The load current which flows through the second auxiliary thyristor when it has ignited flows in the form of a very high control current to the main thyristor, which latter ignites uniformly along its entire inner edge and therefore cannot become overloaded over by currents with very steep gradients.

In the case of thyristors having the usual dimensions, the ratio of the effect edge lengths, facing the control electrode, of the first auxiliary emitter to second auxiliary emitter can be ≥ 1:3 The ratio of the corresponding effective edge lengths of the second auxiliary emitter to main thyristor is to be ≤ 1:4.

In the exemplary embodiment shown in FIG. 1, the ratio of the effective edge lengths of the first auxiliary emitter to the second auxiliary emitter, i.e., the ratio of the edges 12 and that part of the emitter edge 13 which lies opposite the segment 15 is approximately 1:1. The ratio of the effective edge lengths of second auxiliary emitter, namely that of that part of the edge 13 which lies opposite the segment 15 to the main emitter is approximately 1:5 in the exemplary embodiment shown in FIG. 1. The matching of the effective edge lengths, facing the control electrode of the auxiliary emitter to the main emitter causes the main thyristor not to ignite before the second auxiliary thyristor.

The quoted ratios of the effective emitter edge lengths relate to conventional, high-blocking thyristors. These thyristors are dimensioned in accordance with generally known rules. Normally, in high blocking thyristors, the thicknesses of the zones 2 and 4 is about 80 $\mu$m, the edge concentrations about $10^{18}$ and $10^{20}$ atoms/cm$^3$, the thickness of the zone 3 is about 400 $\mu$m and the doping concentration is about $5 \times 10^{13}$ atoms/cm$^3$ and the zones 1, 10 and 8 have a thickness of about 20 $\mu$m with an edge concentration of about $10^{20}$ atoms/cm$^3$. The effective edge length of the first auxiliary emitter which faces the control electrode 7 can, for example, by 20 mm, that of the second auxiliary emitter can be 10 mm and that of the main emitter can be 40 mm. This is a ratio of 2:1 and 1:4. The corresponding edge lengths can also, however, be, for example 10 mm, 20 mm and 200 mm, the 200 mm edge length being achieved by a finger structure of the main emitter. This corresponds to a ratio of 1:2 and 1:10. The quoted ratios lie within the scope of the invention.

A general dimensioning rule is, irrespective of the given dimensions, that the ignition of the second auxiliary thyristor should always take place before the ignition of the first auxiliary thyristor and before the ignition of the main thyristor. An expert in the art can easily check as to whether a thyristor satisfies these conditions by means of potential probe measurements with the aid of an oscillograph. Here one follows the time sequence of the voltage drops between in each case two adjacent electrodes 7, 9, 11 and 5. The control current which flows between the electrodes 7 and 5 produces a voltage drop in the order of 1 V between adjacent electrodes. During the ignition process this voltage changes temporarily. If, for example, the first auxiliary thyristor ignites first, the voltage between all the electrodes will rise, i.e., both between 7 and 9, and between 9 and 11, and 11 and 5.

If, on the other hand, the second auxiliary thyristor ignites first, only the voltage drop between 9 and 11 and 11 and 5 increases. Between 7 and 9, on the other hand, it is reduced. Accordingly, in the event of a primary ignition across the main thyristor, there is an increase in voltage drop only between 11 and 5 whereas it is reduced between 9 and 11 and 7 and 9. By a suitable increase or reduction in the emitter edge length ratios, it is always possible to ensure that the second auxiliary thyristor ignites first.

Figure 4:
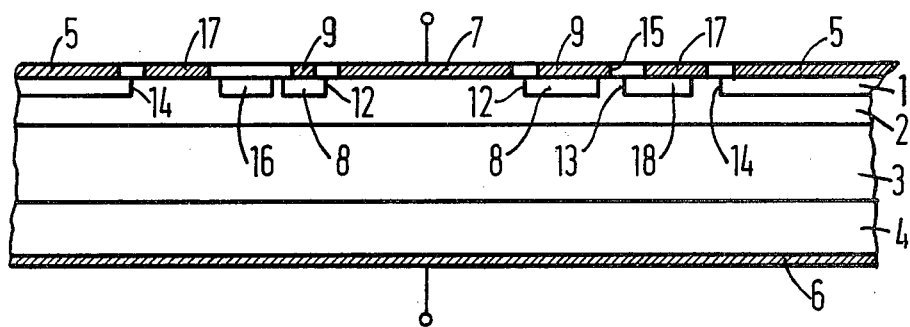
FIG. 4 is a diagrammatic sectional view of the embodiment shown in FIG. 3, as taken along the line IV—IV thereof.

The exemplary embodiment illustrated in FIGS. 3 and 4 bears the same references where the individual positions agree with those in FIGS. 1 and 2. The exemplary embodiment shown in FIGS. 3 and 4 differs from that shown in FIGS. 1 and 2, inasmuch as the second auxiliary emitter 18 is designed as a circular ring segment. Its circular electrode is referenced 17. Between the first auxiliary emitter 8 and the auxiliary emitter 18, and auxiliary emitter electrode 17 is arranged a ballast segment 16 which possesses the same doping as the emitters. The ballast segment reduces the currents which flow away from the electrodes 7 and 9 directly to the electrode 17, and which have no effect on the ignition. The effective length of the edge 13 facing the control electrode 7 of the second auxiliary emitter is again approximately equal to the length of the segment 15.

Figure 6:
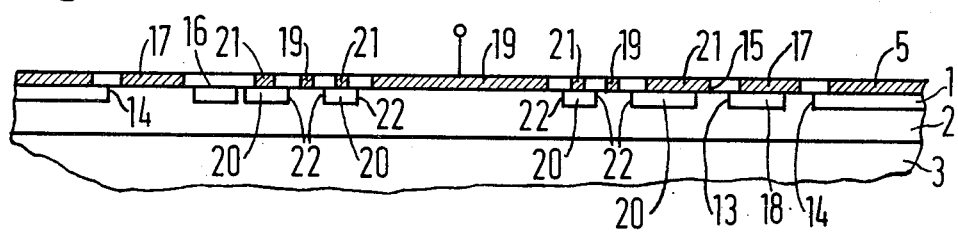
FIG. 6 is a diagrammatic sectional view of the embodiment shown in FIG. 5, as taken along the line VI—VI thereof.

The exemplary embodiment shown in FIGS. 5 and 6 is again provided with the same reference numerals for positions corresponding to those in FIGS. 1 and 2. The exemplary embodiment illustrated in FIGS. 5 and 6 differs from those in FIGS. 1 to 4, basically in that the control electrode, the first auxiliary emitter and the first auxiliary emitter electrode are designed to be finger shaped and engage with one another. The control electrode is referenced 19, while the first auxiliary emitter is referenced 20, and the first auxiliary emitter electrode is referenced 21.

That edge of the first auxiliary emitter which faces the control electrode 19 is referenced 22. The second auxiliary emitter 18 is likewise in the form of a circular ring segment in this exemplary embodiment. The ratio of those effective lengths facing the control electrode of first auxiliary emitter to second auxiliary emitter, i.e., the ratio of the edge 22 to the length of the segment 15 is, in this case, about 4:1, and the ratio of the corresponding edge lengths of the second auxiliary emitter to the main emitter is about 1:6.

Also, in this exemplary embodiment, it is a general rule that the ratio of the edge lengths of the first auxiliary emitter to the second auxiliary emitter is greater than 1:3 and the ratio of the edge lengths of the second auxiliary emitter to the main emitter is less than 1:4. The above described measuring method can be used to easily check whether the arrangement is functioning in the desired manner. The vital point is here again that the first auxiliary thyristor possessing the first auxiliary emitter 20 should on no account ignite until the second auxiliary thyristor has ignited, but should operate merely as current amplifier, and its dynamic current amplification is to be as high as possible for a given control current.

It will be apparent to those skilled in the art that many modifications and variations may be effected without departing from the spirit and scope of the novel concepts of the present invention.

I claim as my invention:

1. A thyristor comprising a semiconductor body having at least four zones of alternate conductivity type, a control electrode in contact with the second zone of said four zones, said first zone having a main emitter and a first and second auxiliary emitter, each of said emitters having an electrode in contact therewith and electrodes of said auxiliary emitters also in contact with said second zone, said first auxiliary emitter being located between said control electrode and said second auxiliary emitter and said second auxiliary emitter being located between said first auxiliary emitter and said main emitter, pn junctions facing the control electrode being formed between each of said emitters and said second zone, effective edge lengths of said pn junctions being defined as those portions of the pn junction which lie opposite electrodes in contact with said second zone, the ratio of the effective edge lengths of the first auxiliary emitter to the second auxiliary emitter and the ratio of the effective edge lengths of the second auxiliary emitter to the main emitter being chosen such that prior to the ignition of said first auxiliary emitter, ignition is initiated on said second auxiliary emitter and then on said main emitter.

2. A thyristor according to claim 1, in which said ratio of the effective edge lengths of the first auxiliary emitter to the second auxiliary emitter is $\geq$ 1:3 and the ratio of the effective edge lengths of the second auxiliary emitter to the main emitter is $\leq$ 1:4.

3. A thyristor according to claim 2, in which the control electrode and the effective edge portion of the first auxiliary emitter which faces the control electrode possess interlocking comb-like structures.

4. A thyristor according to claim 2, in which said control electrode is arranged centrally in the outer surface of said second zone and concentric with and spaced from said first auxiliary emitter electrode.

5. A thyristor according to claim 1, in which a ballast is formed as a circular segment between said first auxiliary emitter electrode and said second auxiliary emitter electrode.

6. A thyristor according to claim 1, in which said portion of said electrode of said first emitter which contacts said second zone is an arcuate segment which lies between said first auxiliary emitter and said second auxiliary emitter.

7. A thyristor according to claim 1, in which said second auxiliary emitter electrode is a circular ring which contacts said second auxiliary emitter and overhangs the outer edge thereof into contact with said second zone.

8. A thyristor comprising
 a. four zones of alternating conductivity type, one of said zones forming a base zone and one of said zones on said base zone comprising a main emitter, a first auxiliary emitter, and a second auxiliary emitter;
 b. a control electrode in contact with said base zone and a main emitter electrode in contact with said main emitter;
 c. first and second emitter electrodes in contact with said first and second emitters respectively, portions of said first and second electrodes being in contact with said base zone;
 d. said first emitter being positioned between said control electrode and second emitter and said second emitter being positioned between said first emitter and main emitter;
 e. pn junctions facing the control electrode being formed between each of said emitters and said second zone, effective edge lengths of said pn junctions being defined as those portions of the pn junctions which lie opposite said portion of the first and second electrodes in contact with said base zone and which lie opposite said control electrode; and
 f. a ratio of the effective edge lengths of the first emitter to the second emitter and that of the second emitter to the main emitter being determined by lengths of said portions of the first and second electrodes such that prior to ignition of said first auxiliary emitter, ignition is initiated on said second auxiliary emitter and then on said main emitter.

9. The thyristor of claim 8 in which the effective edge length ratio of the first emitter to the second emitter is $\geq$ 1:3 and the effective edge length ratio of the second emitter to the main emitter is $\leq$ 1:4.

* * * * *